United States Patent [19]
Resnick

[11] Patent Number: 4,791,602
[45] Date of Patent: Dec. 13, 1988

[54] SOFT PROGRAMMABLE LOGIC ARRAY

[75] Inventor: David R. Resnick, Vadnais Heights, Minn.

[73] Assignee: Control Data Corporation, Minneapolis, Minn.

[21] Appl. No.: 935,054

[22] Filed: Nov. 21, 1986

Related U.S. Application Data

[63] Continuation of Ser. No. 485,080, Apr. 14, 1983, abandoned.

[51] Int. Cl.[4] .......................... H03K 19/00; G06F 7/38
[52] U.S. Cl. .................................. 364/900; 364/716; 307/465
[58] Field of Search ... 364/200 MS File, 900 MS File, 364/716; 307/465, 466, 468, 467, 469; 340/825.79, 825.83, 825.85, 825.86, 825.87; 365/94

[56] References Cited

U.S. PATENT DOCUMENTS

| | | | |
|---|---|---|---|
| 3,783,254 | 1/1974 | Eichelberger | 307/465 |
| 3,818,252 | 6/1974 | Chiba et al. | 307/303 |
| 3,855,536 | 12/1974 | Neuner | 328/92 |
| 3,912,914 | 10/1975 | Moylan | 235/152 |
| 3,976,983 | 8/1976 | Moussie | 340/173 SP |
| 3,987,287 | 10/1976 | Cox et al. | 307/465 |
| 4,034,356 | 7/1977 | Howley et al. | 307/465 |
| 4,051,352 | 9/1977 | Eichelberger et al. | 307/465 |
| 4,157,589 | 6/1979 | Kapral et al. | 364/716 |
| 4,233,667 | 11/1980 | Devine et al. | 364/900 |
| 4,293,783 | 10/1981 | Patil | 307/465 |
| 4,293,919 | 10/1981 | Dasgupta et al. | 364/716 |

FOREIGN PATENT DOCUMENTS 0031431 7/1981 European Pat. Off.

OTHER PUBLICATIONS

IBM Techn. Discl. Bull., V. 21, No. 6, 11/78 "Programmable Boolean Function Generator".

Primary Examiner—Thomas M. Heckler
Assistant Examiner—Kevin A. Kriess
Attorney, Agent, or Firm—Joseph A. Genovese; Michael B. Atlass; William J. McGinnis, Jr.

[57] ABSTRACT

A programmable logic array is constructed of independently controllable logic building blocks of two types and special output logic to perform desired logic functions. The first building block is a functional element which is capable of performing any logical function of its input data to create output data. The functional elements shown are based on three inputs with a single output. The second basic type of building block is a pass-through/hold device which may either pass its input directly through as an output, or which may latch and hold the input until clocked. A plurality of logic levels or ranks of elements of the first type and ranks of the second type are interconnected so that the output can be various functions of the inputs. The logic array described here has first and second logic levels consisting of functional elements followed by a third level of pass-through/hold devices. The fourth and fifth logic levels are functional elements and pass-through/hold devices. The seventh and eighth logic levels are represented by another level of functional elements and pass-through/hold devices. Finally, the output logic is a plurality of output enable gates connected to tri-state buffers. The tri-state buffers may be high, low or floating. The output enable gate functions to either cause a direct pass-through of the input logic signal or activates the tri-state buffer to operate on the output logic level. The logic array is configured and controlled by input control bits pg,2 to characterize the operation of each functional element and pass-through/hold device so that it functions either to produce combinations of input logic levels or to achieve particular logic states or a combination of the two functional modes. The output enable gates are controlled like the functional elements to either enable or disable tri-state control of the output buffers.

26 Claims, 6 Drawing Sheets

SOFT PROGRAMMABLE LOGIC ARRAY

This is a continuation of co-pending application Ser. No. 485,080, filed on 4/14/83 now abandoned.

BACKGROUND OF THE INVENTION

The present invention relates to a type of circuit known as a programmable logic array. Typically, programmable logic or very large scale integrated circuit (VLSI) circuit chips. These programmable logic array chips are of a type that when manufactured, the particular logic function of the circuit is not determined. A programmable logic array chip is designed so that the logic function of the chip may be subsequently determined. Most of such prior art chips are hard programmable in that they contain fuses or other elements which are permanantly burned or blown out in order to determine the logic function of the device. The present invention relates to a soft programmable device in that any particular device may be repeatedly programmed with the same or with different logic functions through a process of inputting logic functional data, which is sometimes known as characterization data. Although a soft programmable logic array requires the loading of characterization data in order to function, the logic array of the present invention is not merely a memory device. The characterization data is used to control the particular logic functions to be performed at particular logic levels in the array. In addition, chips according to the present invention are arranged with four quadrants or sectors and control circuitry on each chip so that several independent arrays are on one chip with common functional control.

Known to applicant in the prior art is U.S. Pat. No. 3,818,252 which shows a plurality of word lines and digit lines as inputs to an array which contains fuses for the programmable elements. This patent shows, in effect, a variation of a standard programmable logic array having two levels for the production of a sum of products type of function, but does not anticipate the present multi-level soft programmable logic array. U.S. Pat. No. 4,233,667 also shows a programmable logic array, but which does not anticipate the present invention in structure or capability.

U.S. Pat. No. 3,912,914 shows a programmable switching module which can become extremely complex for any particularly large switching function to be employed since the programming control for any switching function must be brought off the particular chip by individual wires to control the switching function. The present invention is programmed by inserting a stream of characterizing data which controls the various logic elements as a result of a characterizing process. Other patents known to applicant in the prior art are U.S. Pat. Nos. 3,855,536, 3,976,983 and 4,293,783, all of which show logic arrays but which either require programming control through external logic pins or which have limitations on the particular logic functions that may be accomplished.

SUMMARY OF THE INVENTION

The present invention is a soft programmable logic array which may be controlled to perform particular logic functions by providing an input stream of characterizing data which is latched into the logic array to cause the programmed logic function to be performed. Logic arrays according to the present invention may be grouped together on a chip in sectors with common programming logic for several sectors. In the present embodiment four quadrants or sectors are shown.

The logic array according to the present invention is formed of a number of levels or ranks of logic where each level of logic contains a plurality of particular logic elements. The embodiment of the present invention has two primary types of logic elements. The first type of element is a logic functional element or just functional element. A functional element has a plurality of inputs and is capable of performing all possible logical operations on those inputs. A particular embodiment of the present invention uses functional elements having three inputs and one output as a building block. This functional element has data inputs which are used as the control bits for an 8-to-1 multiplexer where the eight inputs of the multiplexer are latched and represent the programmed logic inputs to control the output function on the data output of the multiplexer.

The second type of logic element in the present invention is a pass-through/hold device which may be set to either latch a particular input until it is clocked or set to allow the pass-through as an output of whatever the data input is. In the embodiment shown, the pass through function also inverts.

By using four levels of functional elements, combined with four levels of function pass-through/hold elements with various interconnections of logic between levels, essentially any logical fuctional output can be achieved for a plurality of inputs. A ninth logic level of output enable and tri-state buffer elements provide for full control of all output logic levels. The interconnections of logic elements at the various levels in the present logic array allow a logical function to occur at all eight levels of logic or to be gated as outputs at earlier levels of logic. Thus, the outputs of the second, third and fourth levels of functional outputs may be gated directly as outputs of the logic array.

IN THE FIGURES

FIGS. 1A, 1B and 1C are intended to be viewed in left-to-right order, side-by-side, and represent a detailed logic diagram of one embodiment of the present invention.

DESCRIPTION OF THE PREFERRED EMBODIMENT

Figure 1A:
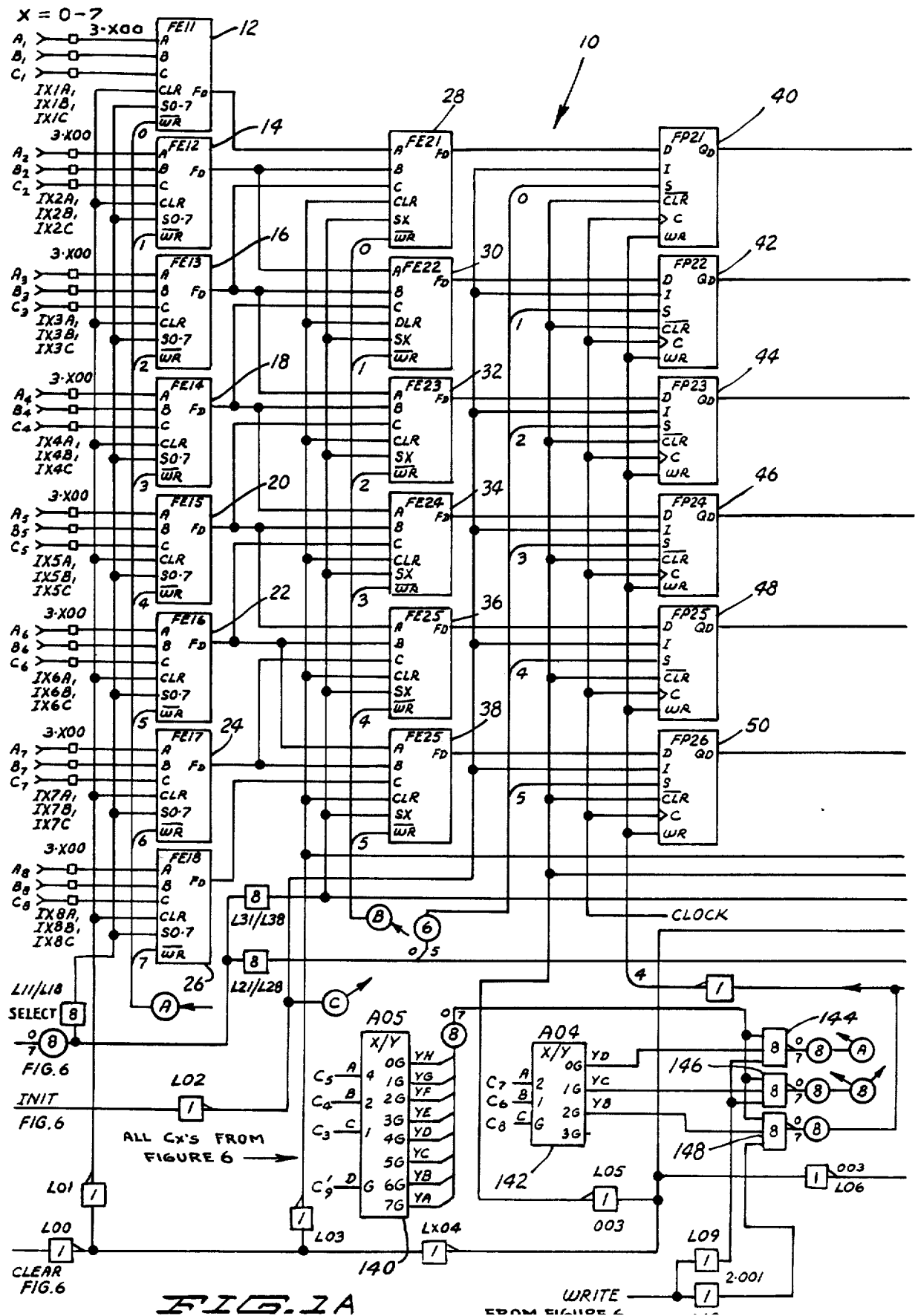
Figure 1B:
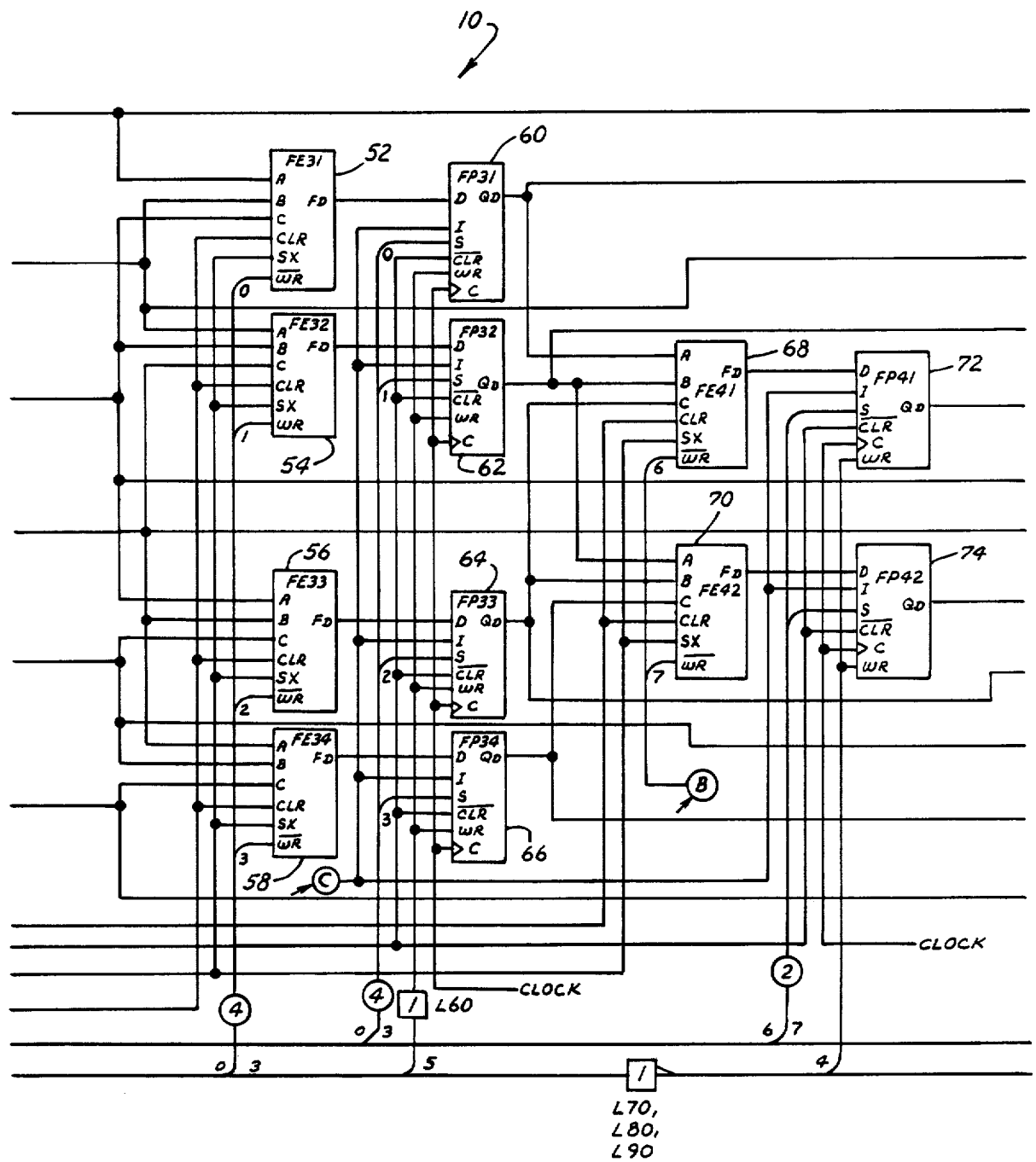

FIGS. 1A, 1B and 1C contain, in left-to-right, side-by-side order, a detailed logic diagram of a soft programmable logic array 10 according to one embodiment of the present invention. The logical data inputs occur at the left-hand side of the diagram and progress through the various logic levels so that outputs, according to the predetermined programmed logic function, occur at the right-hand side of the diagram.

A plurality of functional elements 12, 14, 16, 18, 20, 22, 24 and 26 make up the first logic level of the logic arra 10 according to the present invention. Functional elements 12 through 26 are all identical and the structure of functional element 12 is shown in detail in FIG. 2. Each functional element has three data inputs. The data inputs to functional element 12 are shown as A, B and C with number notation to show the particular functional element number. Similar notation is used for the data inputs for all eight functional elements of the first logic level. Each functional element, 12 through 26, has a single output which is interconnected with the remainder of the logic array 10, as shown in the diagram. A second level of logic is formed of six functional elements 28, 30, 32, 34, 36 and 38. The six functional elements, 28 through 38, are connected to six pass-through/hold devices 40, 42, 44, 46, 48 and 50. These pass-through/hold devices are all identical and a detailed diagram of a pass-through/hold device 40 is shown in FIG. 3. These six pass-through/hold devices constitute the third logic level of the present embodiment of the invention. The outputs of these six pass-through/hold devices are connected as shown in the diagram.

The fourth level of logic in this embodiment of the present invention consists of four functional elements 52, 54, 56 and 58 which receive inputs as shown on the diagram. The outputs of these four functional elements of the fourth logic level are connected as inputs to four pass-through/hold devices which constitutes the fifth logic level. The pass-through/hold devices 60, 62, 64 and 66 constitute the fifth logic level. The sixth logic level consists of two functional elements 68 and 70. The outputs of functional elements 68 and 70 provide inputs to function/pass-through elements 72 and 74 which constitute the eighth logic level of this embodiment according to the present invention. In this figure, each functional element has a number with a prefix of FE with a particular element number. Similarly, all of the pass-through/hold devices are numbered with a particular number and the prefix FP.

The output logic of the present invention consists of a two-stage element which may be thought of as a single function. The first stage of each two-stage element is an output enable gate 80 which is shown in detail in FIG. 4. Each output enable gate 80 is connected with a tri-state buffer 82 which has possible outputs of "High", "Low" and "Floating". The floating output floats with the signal level on the output line assuming that other active logic devices are also connected to the same logic line. Thus, the output function of the present embodiment of the invention is determined by 12 pairs of output devices having 12 output enable gates 80, 84, 88, 92, 96, 100, 104, 108, 112, 116, 120 and 124. Each output enable gate just mentioned is associated, respectively, with a tri-state buffer 82, 86, 90, 94, 98, 102, 106, 110, 114, 118, 122 and 126.

Figure 5:
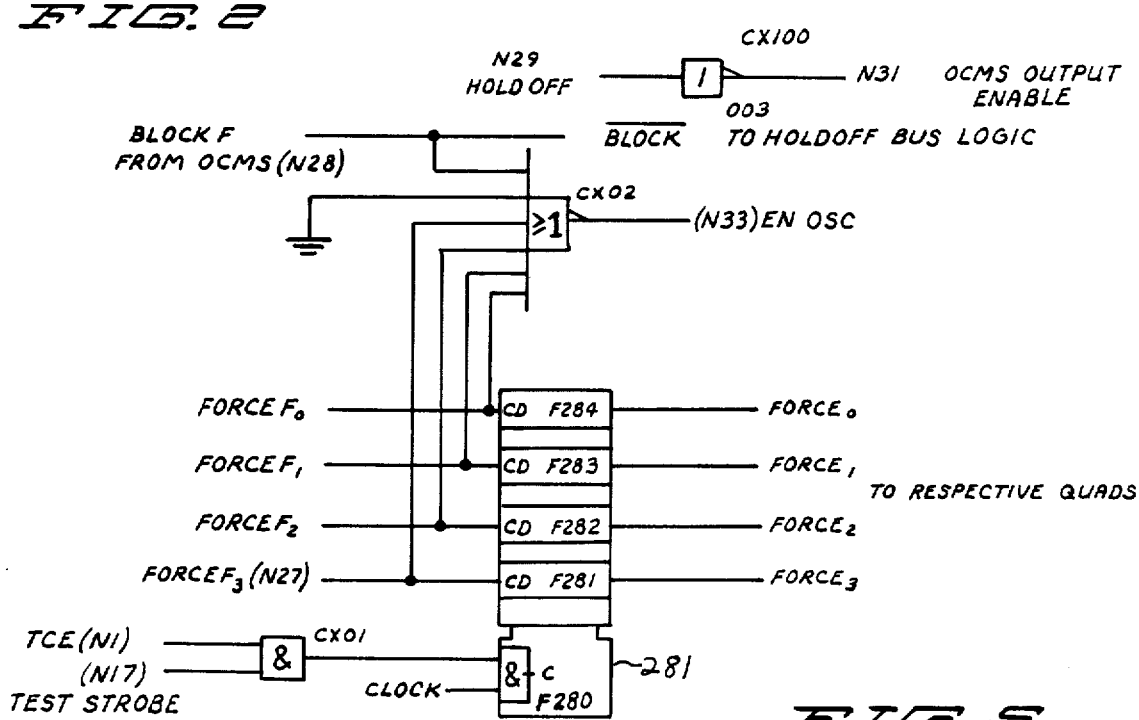
FIG. 5 is a logic diagram of control circuitry according to the present invention for the logic system shown in FIGS. 1A, 1B and 1C.
Figure 6:
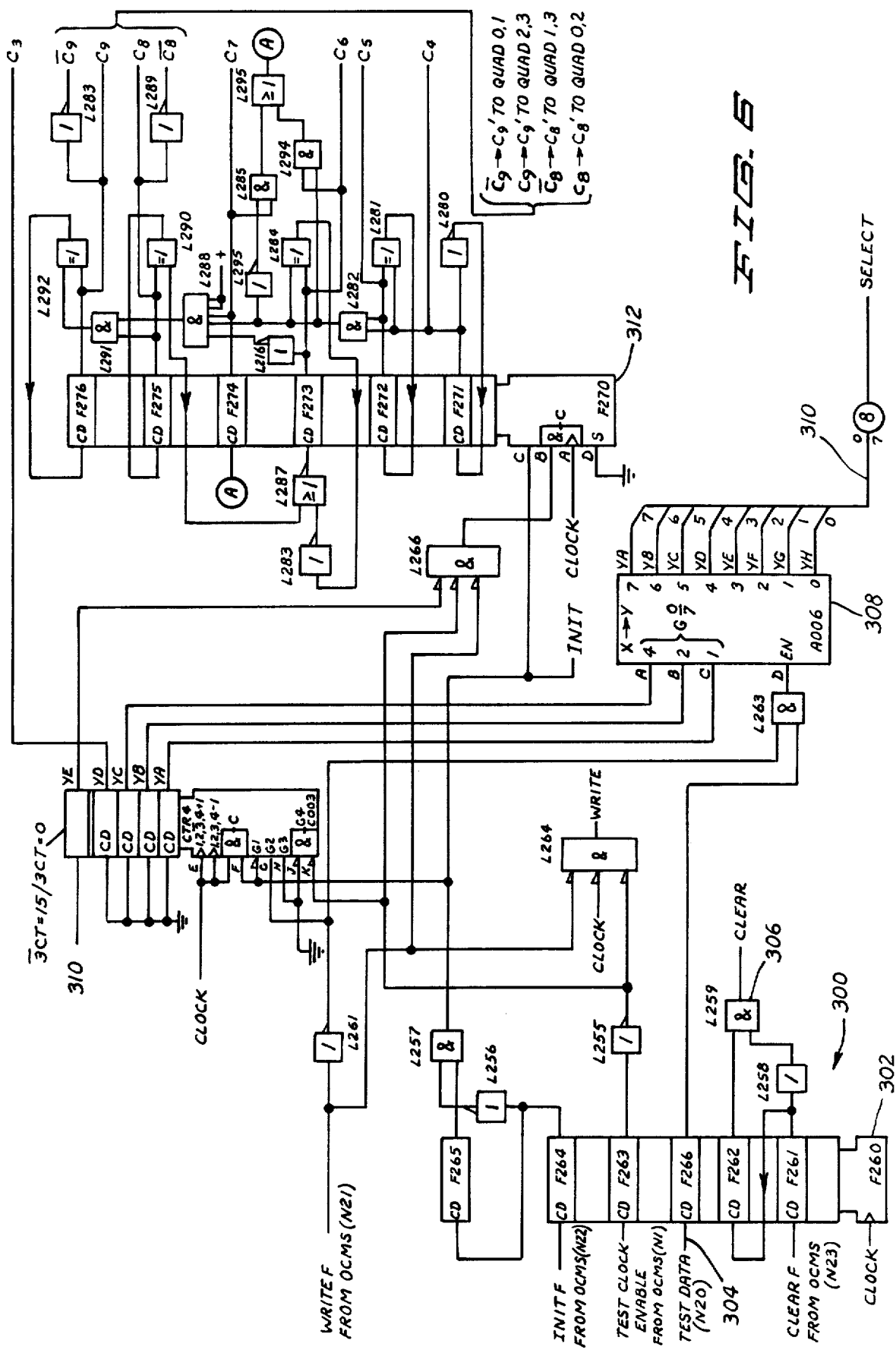
FIG. 6 is a logic diagram of the control circuitry for the characterizing logic according to the present invention used to drive the system of FIG. 1.

The logic array shown in FIGS. 1A, 1B and 1C may preferably be constituted as one quadrant or sector of four identical quadrants or sectors to be put on a single VLSI chip. In different embodiments, a different number of sectors with a common control system may be used. Thus, a single VLSI chip would contain four circuits, as shown in FIGS. 1A, 1B and 1C, arranged in quadrants together with a single control circuit as shown in FIGS. 5 and 6. FIG. 6 is so constituted that it may control four separate circuits of the type shown in 1A, 1B and 1C. The various control lines shown entering FIG. 1A are generated by the control circuit as shown in FIG. 6, which will be described in detail later.

The outputs of the control circuit to each individual quadrant of the array is connected to a 3 input to 8 output decoder 140 shown in FIG. 1A. The C5, C4 and C3 input lines come from the control element of FIG. 6, while the C'9 control line turns the decoder on or off, depending on whether this is the particular one of the four quadrants addressed. Similarly, decoder 142 is a 2 input to 4 output decoding element with the inputs being derived on FIG. 6, while the C'8 line turns the decoder on or off, based on inputs as shown in FIG. 6. Sets of AND gates 144, 146 and 148 control the fanout of the required control signals in order to load the program for the programmable logic function to be performed.

Figure 2C:
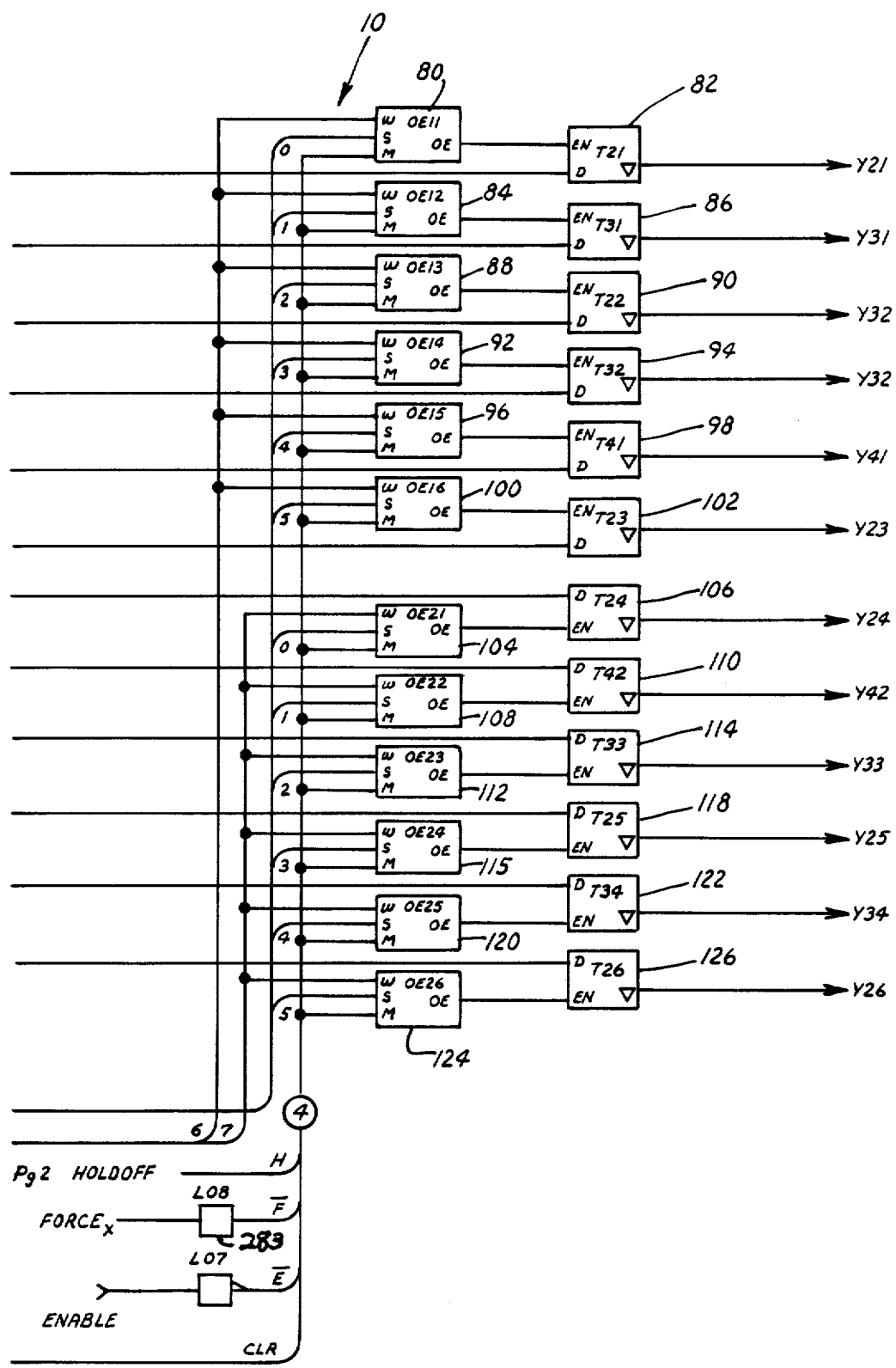
FIG. 2 is a detailed logic diagram of one of the functional elements according to the present invention and shown in FIGS. 1A, 1B and 1C.
Figure 2:
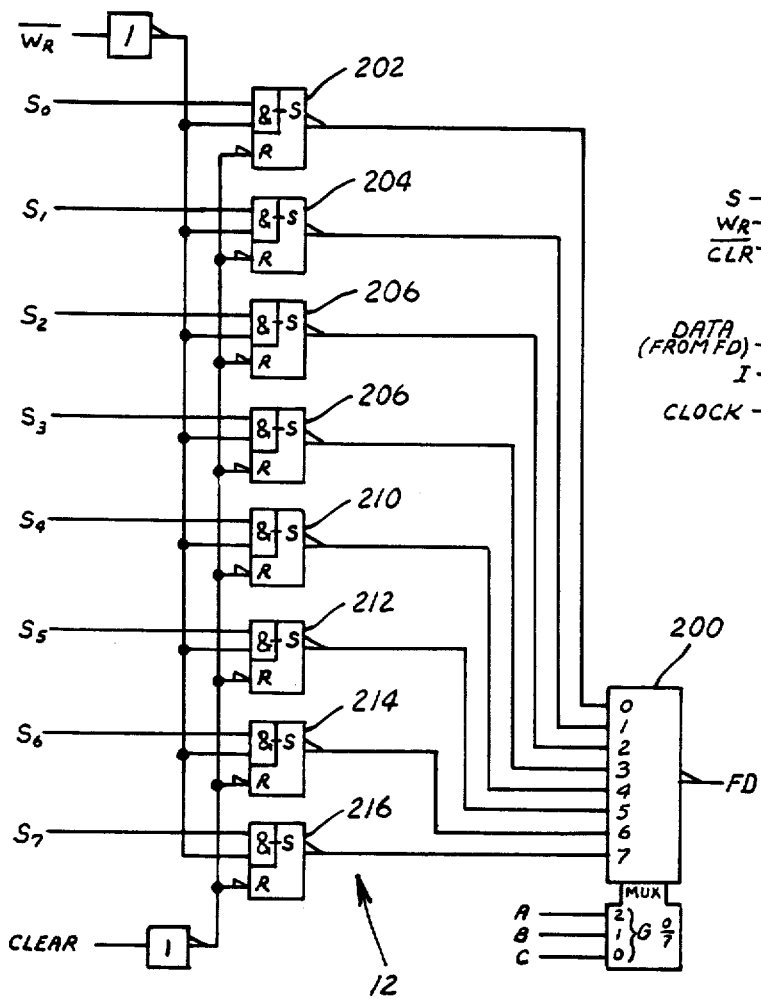
Figure 3:
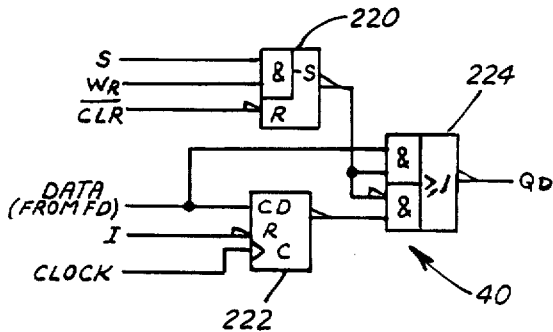
FIG. 3 is a detailed logic diagram of a pass-through-/hold device according to the present invention and shown in FIGS. 1A, 1B and 1C.

Referring now to FIG. 2, a detailed logic diagram is shown of a logic functional element 12 of the type used in the present embodiment of the invention. Each functional element has an 8 bit to 1 bit multiplexer 200 where the output FD represents the data output. The data input is represented by the input signal lines A, B and C which are the select control lines of the multiplexer, but which form the data inputs to the functional element. For each of the eight input lines to the multiplexer there is an AND gate/set latch circuit 202, 204, 206, 208, 210, 212, 214 and 216. The functional or characterizing data inputs to control the functional output of the multiplexer 200 are provided on the program inputs S0 through S7. The clear signal and the write enable signal functions will be explained in connection with the control logic of FIG. 6. Each of the set latches 202 through 216, when programmed with a functional input, will hold that functional input for all operations of the circuit. The clear signal will clear to zero all of the gates as part of the initialization process. The write enable signal must be enabled in order to write or program any function.

It is known from the functional description of a multiplexer that an 8 bit to 1 bit multiplexer having three control inputs may select any one of the possible inputs as an output using a 3 bit control signal. Conversely, it is known that any logical function of three data bits must be either a high or a low data bit. By properly programming the eight input bits to multiplexer 200 with high and low bits, provision may be made for the output of the multiplexer 200 to be any logical function of the three data bits input on control lines A, B, C. This then represents the logical structure of functional element 12 which operates as a building block of the present array, according to invention.

Referring now to FIG. 3, the pass-through/hold device 40, all of which are identical in the present embodiment of the invention, is shown with its detailed logic schematic. Pass-through/hold device 40 consists of a set/re-set AND gate latch element 220, a flip-flop 222, and a gate 224, all connected as shown. If the set/re-set latch circuit 220 is set as part of the characterization function, the data input from the previous section makes the AND gate 224 and the element functions as a data pass-through circuit, and inverts the data while passing it through without significant time delay. If the set/re-set latch circuit 220 is not set, then for data to pass through the unit a clock signal must initiate flip-flop 222 in addition to the data input in order to make the gate 224 pass the data.

Figure 4:
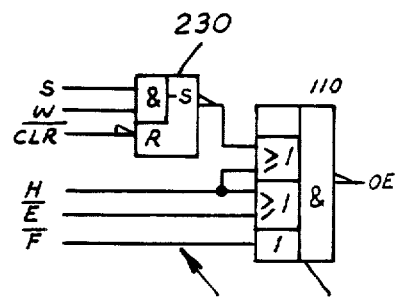
FIG. 4 is a detailed logic diagram of an output enable logic element according to the present invention and shown in FIG. 1C.

Referring to FIG. 4, the output enable circuit 80 is formed of a set/re-set latch circuit 230 together with a gate 232. If the output of the output enable gate 232 is on, the buffer is responsive to be high or low in response to the data input to the buffer. If the output enable line of the output enable gate 232 is not enabled, then the associated buffer is lines to the output enable gate 232 function as follows: H holds or forces the gate to be off; F is a test input and forces the output to be enabled; and E is the normal enable function input.

FIG. 5 shows the control system register 281 which produces the FORCE control functions input to gate 283 as shown in FIG. 1C and respectively for the other similar quadrants.

Referring now to FIG. 6, a control circuit according to the present invention for controlling the circuit of FIG. 1 as one of four identical circuits is shown. The control circuit 300 has a controlling clock 302. The input characterizing data stream is provided on input 304. The input test data stream may be provided in a standard computer environment as one function of the test maintenance logic system outside of the normal data paths as part of the initializing function. The clock 302 performs a set, clear and forget function. That is, it prepares a one shot signal for controlling the various clear bits on clear output 306 so that all circuits are intially cleared, but because a one shot is formed, the clear signal does not need to drop out, it drops out automatically.

Decoder 308 works in conjunction with counter 310 to provide an 8 bit output channel for gating in common to the various functional element units 12. Thus, the input serial stream of data on a 1 bit channel is controlled by the counter 310 with decoder 308 so that each functional element, such as element 12, which is addressed by the 8 bit output select channel 310, has its program inputs sequentially triggered. Counter 312 provides output control signals on lines C as shown to FIG. 1 for controlling which select logic on which functional elements 12 or which pass-through/hold devices 40 are triggered for addressing of the programming function. The counter also controls which output enable element is addressed.

Figure 7:
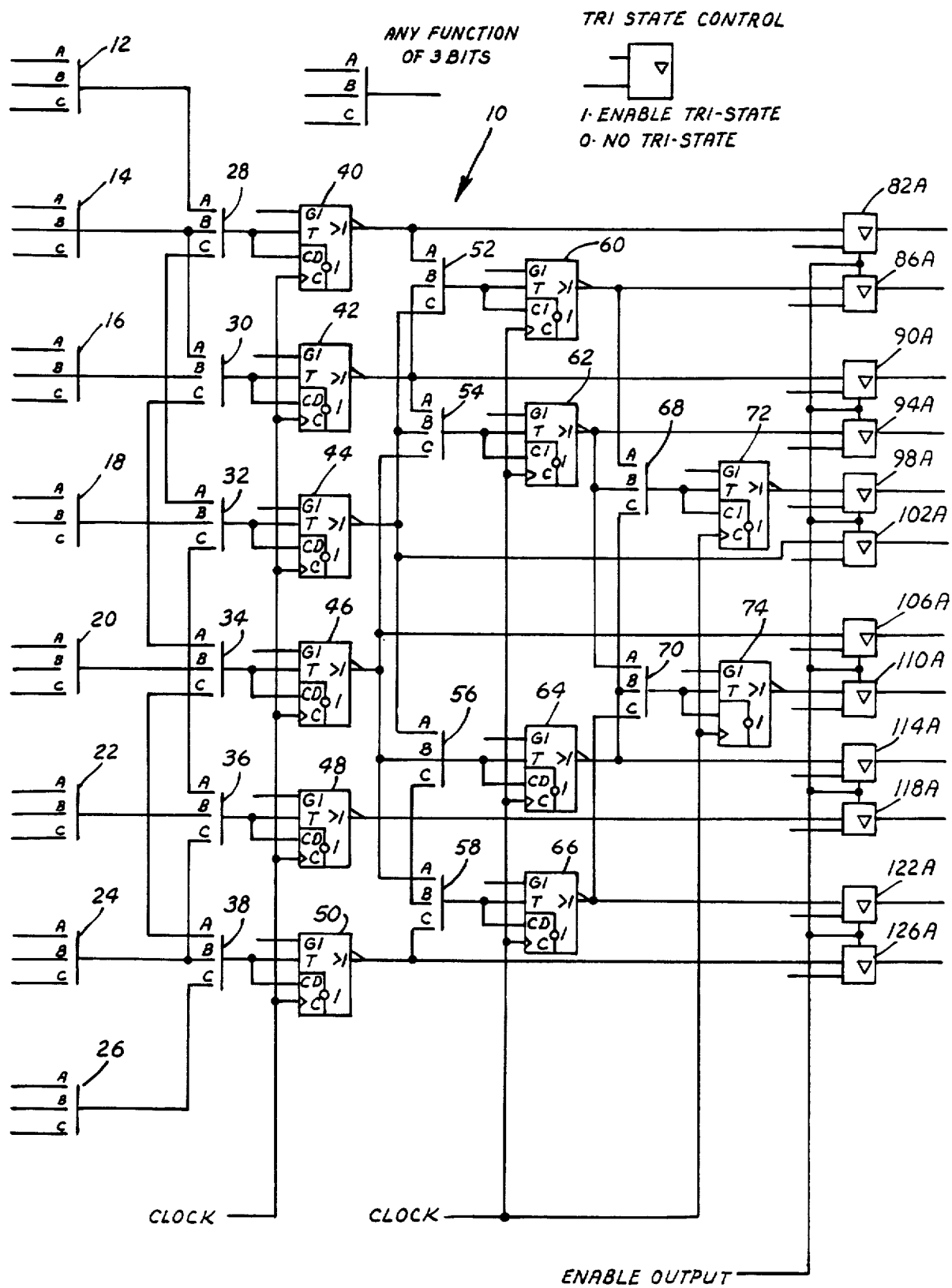
FIG. 7 is a simplified logic diagram of the system shown in FIG. 1, according to the present invention, showing only essential logic interconnections.

Referring now to FIG. 7, a simplified schematic logic diagram is provided according to the present invention as shown in FIGS. 1A, 1B and 1C is shown. The logic devices are only shown symbolically and the various programming and control function lines are not indicated. Thus, reference Nos. 12, 16, 18, 20, 22, 24 and 26 are used on FIG. 7 to indicate functional elements just as on FIG. 1A because the device and the function is intended to be the same. Thus, FIG. 7 shows the same logic system as shown in FIGS. 1A, 1B and 1C with eight levels of logic and an output level forming the soft programmable logic array 10. The one significant difference in the Figure is that the two-stage pairs of output elements, as shown in FIG. 1C, are simplified to a single output element in FIG. 7. Thus, the combined output enable gate and tri-state buffer devices are indicated on FIG. 7 with the numbers 82A, 86A and so, respectively, to 126A to indicate correspondence to the tri-state buffers 82, 86, 90 and so on up to 126, as shown in FIG. 1C.

The soft programmable logic array, according to the present invention, is designed to solve one of the recurring problems in logic design, that of "gluing" parts of a system in simple control functions. This is to distinguish from significant arithmetic functions like adders and multipliers which are usually specially designed. Although the logic array, according to present invention, could be designed to form an addition or multiplying function, it would not be typically efficient. The logic array, according to the present invention, is considered to be most efficient in performing stray, leftover or "glue" functions of the sort that are needed to complete the logic of an arithmetic or Boolean operation system in a computer. For example, if a computer system has four separate 16 bit adders, or even multipliers, that operate separately in 16 bit mode, then it would be useful to use a soft programmable logic array to allow for control and logic functions for allowing the four separate systems to operate in parallel in a 64 bit mode. It is not intended that the soft programmable logic array be used to implement the entire control section of a computer mainframe. Dedicated microcode and dedicated arithmetic or Boolean functions would be more efficient for designs as large as that. Instead, the soft programmable logic array will work well for functions such as overflow detection in an arithmetic logic unit or control distribution for tri-state bus usage.

The prior art used fused techniques in making programmable logic arrays. However, there is no useful or economical way to introduce fuse-type programmable logic into very large scale integrated circuits. The present invention fulfills such a need by providing for either combinational or sequential logic functions which may be selected and mixed by the user as a result of characterization data.

The base functional element of the logic array, according to present invention, is a logic unit or functional element 12 that can be configured to implement any logic function of three inputs. A number of logic levels or ranks of these elements is connected together to form the logic array as a whole. A first rank of these elements is tied to the input pins and the outputs of the first rank of functional elements drive the next succeeding rank of functional elements.

There are four separate groups of functional elements in the embodiment of the invention shown. There are four separate groups of logic arrays, according to this embodiment of the present invention, on a single VLSI chip and each such array is referred to as a sector or quadrant since it is one of four identical copies. Within each quadrant or sector of the array there are eight functional elements in a first rank connected to 24 input pins. There are six functional elements in a second logic level or rank, four functional elements in a third logic level or rank, and finally two functional elements in a last or fourth logic level or rank. All functional level outputs of the second and succeeding ranks are connected to chip output pins in addition to supplying output to succeeding output level ranks. This means that a user can implement up to six moderately simple logic equations or up to 12 mixed term logic equations, or as few as two complex logic equations, using the various combinations of functional elements in logic level arrays. The most complex equation that can be programmed in a given logic array of the type shown in FIGS. 1A, 1B and 1C can encompass seven functional elements with 21 input pins.

At the output of each functional element in each rank, except those of the first rank, is a selectable flip-flop or pass-through/hold unit. Each flip-flop is selectable to function as a single cycle holding register or to pass data directly through with no data latching and with minimum delay. There is an input on each flip-flop that allows all flip-flops to be forced clear under system control for testing.

Associated with each chip output pin is an output element that controls the tri-state control line of each output pin buffer. A user can force the output pin to be constantly enabled, that is, the data output never turned off, as well as enabling an input pin associated with each of the four quadrants to control the tri-state line of each output pin of a quadrant.

Each functional element, such as element 12, contains an 8-to-1 multiplexer driven by eight memory latches and three select inputs, A, B and C, that are decoded to select the state of one latch to the multiplex output. The eight data latches are set and cleared to implement the desired logic function of the A, B, C inputs. The eight data latches form a full truth table for three inputs, allowing any logic function of three bits to be implementing by setting and clearing the required data latches. As a simple example, FD=A*B*C is made by clearing all data latches except for the latch associated with S7, which is set. The truth table for any required logic function is easily found by several well-known logic methods.

All latches are initialized by circuitry controlled from the management system as shown in FIG. 6. All latches are cleared at the same time and then conditionally set sequentially by data coming in the test data output pin 304. Within each functional element, latch bit zero is strobed first and then latch bits are strobed in order with latch bit 7 occurring last.

The pass-through/hold flip-flop 40, as shown in FIG. 3, is a 2-to-1 multiplexer that is controlled by a latch bit which is identical to the latch bits 202 in the functional element 12. The latch bits are also controlled in the same manner under the system control functions provided by the unit in FIG. 6. If the latch bit is cleared, then the input data from the driving functional element is passed directly to the output of the multiplexer, and thence to the output pin and succeeding functional elements, if any. In this case, the data is inverted. This must be taken into account when writing the logic equations of succeeding levels of functional elements. If the latch bit is set, then the output of the flip-flop is connected to the multiplexer output. Note that in this case, data is not inverted from the input to the output as in the direct pass-through case. This change in inversion between flip-flop and pass-through mode causes no problems because the data latch is a write-once device only at the power-up condition. It, thus, cannot change during use. The fact that data is inverted can be taken into account by generating the logical complement of the required logic function in the function element driving the particular input.

The flip-flop 222 is clocked continuously without any gating. This means that in order to build state-sequential circuitry, the output of the function must be connected back to a chip input as an input to the defining logic equations. There is a reset input to the data flip-flop that comes from the management control system showin in FIG. 6 that can be used to initialize the flip-flops for usage or testing. The output enable device 80, shown in FIG. 4, is connected to the tri-state control line of each functional output pin. The output enable has three differing modes of operation.

The first mode of the output enable is a data bit of storage that, if set, will hold the respective tri-state control line high with the output enabled, except that the output pin can be forced off by the output disable Hold-off bus.

The second operational condition is that if the data bit is clear, then the input/output pin in common for each output enable device in a quadrant can control the tri-state control line. A high level on this pin will enable all output buffers and the corresponding logic array quadrant, except that the Hold-off bus again can override the enable line.

The third mode of operation is that each output in a quadrant can be forced on, output enabled, by a function bit in the control system register 281 shown on FIG. 5. Thus, there are four individual control bits. While it is expected that this facility will normally be used for maintenance, there is nothing precluding its use in system operation. The control system interface function shown in FIG. 6 is an integral part of the soft programmable logic array and provides initialization with characterizing data. This is because the array has no function until the maintenance system loads the data latches that describe selected logic function. The data latches that implement the required logic functions are loaded by first clearing all the data latches in all quadrants and then setting each latch individually, if required, with the data coming from the test data input. There is a bit counter, on chip, that counts from zero to 767. Of the 768 counts, 736 are bit latches for 184 latches in each quadrant plus 8 extra counts. Each function latch is set if the test data input bit is a one and then the counter is incremented. This counter is simply bumped by one if the input bit is zero. The function bit descriptions for the control functions are as follows: The WRITEF function is active if bit one of the control register is set when a test strobe input pin is active. The WRITEF must be active to enable the writing of the function description latches. WRITEF can be set in the same control word as INITF and CLEARF. When WRITEF is active and the test clock enable input pin is high, the state of the test data input pin is written into the currently addressed latch.

The INITF function is activated if bit 2 of the control register is set when the test strobe input pin is active. INITF performs two functions: (1) it clears to zero the address counters that select individual funtion latch bits, and (2) it also clears all interstage flip-flops in all four logic quadrant arrays. INITF is a one-shot function in that it is active for only one clock at the leading edge of test strobe becoming active. This means that this function can be in the sequences required in order to write the function description latches. This is done by holding the test clock enable control line low or inactive when bringing test strobe high. After a delay of at least two clock cycles, the test clock enable can be brought high and the description latches are written.

The CLEARF function is activated if bit 3 of the control register is set when the test strobe input pin is active. 14. CLEARF clears to zero all function description latches in all quadrants. This must be done at power-up time when the logic array is first being written and can be performed at other times to change the chip function. CLEARF is not necessary if it is required that the description latch that is holding a zero be changed to a one. A function of WRITEF/INITF is used with a data stream of all zeros except for ones at the required change locations. CLEARF is a one-shot function in that it is active for only one clock cycle at the leading edge of a test strobe becoming active. This means that this function can be in the same function control word as WRITEF to supply the control sequences required in order to write the function description latches. This is done by holding the test clock enable low when bringing the test strobe high. After a delay of at least two clock cycles, the test clock enable can be brought high and the description latches written.

The four functions, FORCEF0 through FORCEF3, respectively, representing bits 4, 5, 6 and 7 of the control register 281, force all output pins active in the respective quadrants. The function overrides the state of the output enable pin, the Hold-off bus, and the state of any function description latch in the output enable gates. While it is expected that these function bits will be used mainly by diagnostics, they can also be used during normal system operation. The four bits are loaded into a static holding register at a leading edge of a test clock enable signal.

The BLOCKF function is active if bit 8 of the control register is active when the test strobe input is active. BLOCKF disables all output pins in all quadrants. This function overrides the output enable pins and the state of any function description latch in any output enable device. BLOCKF forces the hold-off bus into the disable mode. BLOCKF will not override any active FORCEF function.

A logic array, according invention, has several desirable attributes. First, the logic array is configured for the function being performed. If the part or array is moved from one location in the system to another location, it implements the logic equations for the new location without any physical change of the part. The delay of a logic signal through the part is proportional to the complexity of the logic equation being implemented. Several simple equations can be done, or few or more complex equations, thus giving the logic designer additional flexibility. The logic array implements variable functions among a fixed set of inputs rather than the previous fixed equations on variable inputs of the prior art. The flip-flops, which are part of the logic path, can be used to implement state equations or can be disabled to implement combinational logic.

The first level functional elements feed into second level functional elements. Each individual second level functional element can then drive its own output pin or it can feed third level functional elements which drive output pins. The third levels can in turn drive fourth level outputs. Because of this interconnection, the array can have all ouputs on the second level active so that up to six moderately simple equations can be solved in the array. As large equations get more and more complex, the third and fourth level elements can be used to allow wider and wider first and second level pieces to be part of the logic equation and solve thereby more and more complex logic equations.

Both logic types of solutions can be used at the same time. In other words, some simple logic equations should provide signals that can also go into more completed logic equations. Second and third level outputs can be active at the same time that third and fourth level outputs are active, so that simple and complicated logic functions are produced simultaneously. By choosing the state of the pass-through/hold devices, whether they are holding or passing data, some of the logic equations can be state equations and some of the logic equations can be pure combinational equations.

What is claimed is:

1. A soft programmable logic array for selectively providing every possible function for operating on a set of data input thereto such that any one of said possible functions may be performed in a single pass, having:
   an output,
   a plurality of logic ranks each rank having logic inputs, data inputs, and data outputs which are a predetermined function of the inputs, each logic rank being formed of a plurality of configurable functional element means wherein each functional element means has inputs connected to receive data inputs and logic inputs connected to receive configuration logic inputs and outputs connected to provide data output which is the solution to a logic equation (operated on the data inputs) determined by the set of logic inputs received by that functional element means, each of said functional element means also having a plurality of latches equivalent to the number of possible output states for holding a predetermined logic indication of the associated output state corresponding to the logic function implemented,
   a plurality of ranks of flip-flop pass-throughs having an input connected to receive a configuration logic datum, in each said rank a flip-flop pass-through is paired to a functional element means, a flip-flop pass-through having an input connected to receive the data output of that one of said logic rank's functional element means and a flip-flop pass-through also having an output connected to a data input of at least one of the functional element means in the succeeding logic rank and connected to the output of said logic array wherein each said flip-flop pass-through may invert a logic condition and pass that condition through without delay or latch a logic condition until released, depending on the configuration logic datum supplied thereto, and
   control means for setting all of said functional elements and flip-flop pass-throughs with individual configuration logic data to cause the array to perform a predetermined logic function on the data input,
   wherein the output of each functional element in each preceding logic rank is provided as one input to at least one functional element of a succeeding logic rank and at least one functional element output in each preceding rank is provided to a data input of a plurality of functional elements in a succeeding logic rank.

2. The array of claim 1 comprised as follows:
   a first logic rank of eight functional elements connected to receive system data inputs,
   a second logic rank of six functional elements connected to the outputs of said first logic rank,
   a third rank of six flip-flop pass-throughs connected to the outputs of said second logic rank,
   a fourth logic rank of four functional elements connected to the outputs of said third rank,
   a fifth rank of four flip-flop pass-throughs connected to the outputs of said fourth logic rank,
   a sixth logic rank of two functional elements connected to the outputs of said fifth rank,
   a seventh rank of two flip-flop pass-throughs connected to the outputs of said sixth logic rank, and
   an eighth rank of twelve output enable gates connected to the outputs of said third, fifth and seventh ranks.

3. The apparatus of claim 2 wherein the output of each output enable gate may be forced to be high, low or floating in one mode or may connect the input function as the output in another mode of operation.

4. The apparatus of claim 2 wherein each functional element has three data inputs, eight logic control inputs and one output.

5. The apparatus of claim 4 wherein each functional element is comprised of an eight-to-one multiplexer and eight AND gate/set latch circuits connected as the inputs to the multiplexer.

6. A soft programmable logic array comprising:
a first logic rank of functional elements each of which produces logic functional outputs which are predetermined logic functions of the inputs,
a second rank of functional elements connected to said first rank each of which produces logic functional outputs which are predetermined logic functions of the inputs,
a third rank consisting of flip-flop pass-throughs connected to second rank to perform an inverting non-delayed pass-through or a latch function according to a predetermined function,
a fourth rank of functional elements connected to receive inputs from said third rank of flip-flop pass-throughs each of which produces logic functional outputs which are predetermined logic functions of the inputs,
a fifth rank consisting of flip-flop pass-throughs connected to said fourth rank to perform an inverting non-delayed pass-through or a latch function according to a predetermined function,
a sixth rank of functional elements connected to receive inputs from said fourth rank of flip-flop pass-throughs, each of which produces logic functional outputs which are predetermined logic functions of the inputs,
a seventh rank of flip-flop pass-throughs connected to receive data inputs from said said sixth rank to perform an inverting non-delayed pass-through or a latch function according to a predetermined function,
an output enable rank connected to receive inputs from said third, fifth and seventh ranks of flip-flop pass-through elements to provide data output for said logic array, and
control means connected to all of said functional elements and flip-flop pass-throughs for controlling and clocking said logic array and for providing latch inputs to set all of said functional elements and said flip-flop pass-throughs to perform a predetermined logic function, and
wherein the output of each functional element in each preceding logic rank is provided as one input to at least one functional element of a succeeding logic rank and at least one functional element output in each preceding rank is provided to a data input of a plurality of functional elements in a succeeding logic rank.

7. The structure of claim 6 wherein each functional element has three data inputs, eight logic control inputs, one data output and is comprised of an eight-to-one multiplexer and eight AND gate/set latch circuits as inputs to the multiplexer.

8. A soft programmable logic array comprised of:
a plurality of logic sectors, each sector having logic inputs and outputs which are independent from those of the other sectors of said plurality of logic sectors,
a plurality of logic ranks comprising each of said sectors, each logic rank formed of functional elements wherein each logic rank has its inputs connected to receive data input and produces data outputs which represent logic equations of the data inputs, where each functional element has a plurality of inputs connected to at least one output such that the output can be any logical function of the inputs, said functional elements including a plurality of latches equivalent to the number of possible output states for holding a logic indication of the associated outputs state corresponding to the logic function implemented, a plurality of ranks of flip-flop pass-throughs having inputs connected to receive outputs of one of said logic ranks and outputs connected to the inputs of another one of said logic ranks and to the output of said sector, each of which may invert a logic condition and pass that condition through without delay or latch a logic condition until released depending upon a predetermined logic function to be implemented, and
control means connected to all of the said sectors for setting all of said functional elements and all of said flip-flop pass-throughs to perform predetermined logic functions in each sector,
and wherein the output of each functional element in each preceding logic rank is provided as one input to at least one functional element of a succeeding logic rank and at least one functional element output in each preceding rank is provided to a data input of a plurality of functional elements in a succeeding logic rank.

9. The logic array of claim 8 wherein each sector is comprised of:
a first rank of logic elements connected to receive data inputs to said system and having inputs to receive a first set of logic signals to set the latches of said first rank of logic elements,
a second rank of logic elements connected to said first rank of logic elements consisting of functional elements and having inputs to receive a second set of logic signals to set the latches of said second rank of logic elements,
a third rank of flip-flop pass-throughs having inputs to receive a third set of logic signals to set the latches of said third rank flip-flop pass-throughs,
a fourth rank of logic elements connected to receive inputs from said third rank of flip-flop pass-throughs and having inputs to receive a fourth set of logic signals to set the latches of said logic elements,
a fifth rank of flip-flop pass-throughs connected to receive inputs from said fourth rank of logic elements and having inputs to receive a fifth set of logic signals to set the latches of said fifth rank of flip-flop pass-through elements,
a sixth rank of logic elements connected to receive data inputs from said fifth rank flip-flop pass-throughs and having inputs to receive a sixth set of logic signals to set the latches of said sixth rank of functional elements,
a seventh rank of flip-flop pass-throughs connected to receive data inputs from said sixth rank of logic elements and having inputs to receive a seventh set of logic signals to set the latches of said seventh rank of functional elements, and an eighth rank of gates connected to receive inputs from said third, fifth, and seventh rank of flip-flop pass-through elements to provide data output for said logic array and having inputs to receive an eighth set of logic signals to set the latches of said output enable gates.

10. The structure of claim 9 wherein each functional element has three data inputs, eight logic control inputs, one data output and is comprised of an eight-to-one multiplexer and eight AND gate/set latch circuits as inputs to the multiplexer.

11. A soft programmable logic array for performing a preselected logic function on a data input function comprising:

- a first rank of logic elements each of said logic elements consisting of functional elements having a plurality of data input receiving lines, at least one data output line and means for receiving and latching control signals representative of the function to be performed connected to receive data inputs to said system and a first set of logic signals to set the latches of said first rank of logic elements,
- a second rank of logic elements connected to said first rank of logic elements, consisting of functional elements each having a plurality of data input receiving lines connected to said first rank, at least one data output line and means for receiving and latching control signals representative of the function to be performed connected to receive data inputs to said second rank and a second set of logic signals to set the latches of said second rank of logic elements,
- a third rank of logic elements connected to said second rank and consisting of flip-flop pass-throughs having means for receiving and latching a third set of logic signals to control the function performed by said flip-flop pass-throughs,
- a fourth rank of logic elements each of said logic elements consisting of functional elements each having a plurality of data input receiving lines, at least one data output line and means for receiving and latching control signals representative of the function to be performed connected to receive inputs from said third rank of flip-flop pass-throughs and having means for receiving and latching a fourth set of logic signals to set the latches of said functional elements to perform the predetermined logic function,
- a fifth rank of logic elements connected to said fourth rank and consisting of flip-flop pass-throughs having means for receiving and latching a fifth set of logic signals to control the function performed by said flip-flop pass-throughs,
- a sixth rank of logic elements consisting of functional elements connected to said fifth rank each having a plurality of data input receiving lines, at least one data output line and means for receiving and latching control signals representative of the function to be performed connected to receive data inputs from said fifth rank of flip-flop pass-throughs and having means for receiving a sixth set of logic signals to set the latches of said functional elements to perform the predetermined logic functions,
- a seventh rank of logic elements connected to said sixth rank consisting of flip-flop pass-throughs each having a plurality of data input receiving lines, at least one data output line and means for receiving and latching control signals representative of the predetermined function to be performed, and
- an output enable rank connected to receive inputs from said third, fifth, and seventh rank of flip-flop pass-through elements to provide data output for said logic array, and wherein the output of each functional element in each preceding logic rank is provided as one input to at least one functional element of a succeeding logic rank and at least one functional element output in each preceding rank is provided to a data input of a plurality of functional elements in a succeeding logic rank.

12. The structure of claim 11 wherein each functional element has three data inputs, eight logic control inputs, one data output and is comprised of an eight-to-one multiplexer and eight AND gate/set latch circuits as inputs to the multiplexer.

13. The apparatus of claim 11 and further comprising control means for providing a serial stream of control signals for input into all of the latches of said functional elements and a stream of latch set control signals to cause the setting of the appropriate latch control signal in the appropriate latch.

14. The apparatus of claim 11 and further comprising clock control means to control the gating of the appropriate control signals to the appropriate functional elements in logic rank order during operation of the logic array.

15. The apparatus of claim 13 wherein a counter is incremented by receipt of each datum of an input serial data stream which represents individual control signals (including at least, each set of logic signals for each rank) and wherein said counter has an output count for controlling the addressing of said functional elements and their latches.

16. In a single integrated circuit chip a programmable logic array (having at least data inputs to receive data from off-chip, configuration logical data inputs to receive configuration data which determines the logical equations which operate on the data from the data inputs, and data outputs) which can provide, on said data outputs, the solution to every possible logic equation applied to the data input to said logic array, and which can provide further logical operations on these solutions such that complex, multistep logic equations may operate on a given set of input data, and wherein said programmable logic array may be programmed and reprogrammed by configuration logical data (the logical or physical control of which may occur on- or off-chip) to provide during the normal operation of the system into which such array is incorporated a repeatable or changeable logical configuration to operate on any set of data input thereto wherein said array comprises:

at least two ranks of functional elements wherein a first rank is comprised of configurable functional element means (hereinafter "FE"s) each FE having a plurality of data inputs (in this first rank, received from off-chip) having configuration logic inputs(s), and providing as output the solution to any logic equation which could be applied to the data input thereto, said FE being configurable by said configuration logic inputs, the ratio of the number of logical inputs to data inputs in each functional element being L/D such that the equation $L = 2^D$ is satisfied;

a second rank also comprised of FEs wherein the data outputs of each first rank FE provides data input to at least one of said second rank FEs and may provide one datum input to as many FEs as there are data inputs to each FE;

control means to direct the supply of configuration logic to input to each said FE, and wherein data outputs from each FE of lower numbered rank is provided to at least one FE data input of higher numbered rank and wherein data output from at least one FE of lower numbered rank provides data input to more than one FE data input of higher numbered rank.

17. A programmable logic array as set forth in claim 16, wherein said logic array further comprises a first rank of flip-flop pass-through means (hereinafter called "FFPT"s) connected to receive as inputs one data output from each FE in the preceding rank (said second rank of FEs in this claim), and connected to receive configuration logic data, wherein the output of each FFPT may hold for one clock the passing through of the data it receives as input or may pass-through the data it receives without holding it in accord with configuration logic data, and wherein said control means directs a supply of configuration logic data to each said FFPT to determine whether the FFPT holds or directly passes the data and wherein the passed data from each FFPT in the rank may provide input to a succeeding rank of FE's or may be directed as output from the array.

18. A programmable logic array as set forth in claim 17 wherein said logic array further comprises a rank of tri-state buffer circuits, each of which is connected to receive configuration logic and the data output from one of the FFPTs and wherein said configuration data either enables or disables the output of said tri-state buffer circuit, which, when enabled, may provide as output from the array the data input thereto from its corresponding FE and when disabled may provide a floating output.

19. A programmable logic array as set forth in claim 16 wherein said array further comprises an intermediate rank of flip-flop pass-through means (hereinafter called "FFPT"s) connected to receive as inputs one data output from each FE in said first rank of FEs, and connected to receive configuration logic data, wherein the output of each FFPT may hold for one clock the passing through of the data it receives as input or may pass-through the data it receives without holding it in accord with configuation logic data, and wherein said control means directs a supply of configuration logic data to each said FFPT to determine whether the FFPT holds or directly passes the data and wherein the data output from this intermediate rank may be directed to the second rank of FEs or off-chip.

20. A programmable logic array as set forth in claim 17 wherein said logic array further comprises a rank of tri-state buffer circuits, each of which is connected to receive configuration logic data and the data output from one of the FFPTs and wherein said configuration data either enables or disables the output of said tri-state buffer circuit, which, when enabled, may provide as output from the array the data input thereto and when disabled may provide a floating output.

21. A programmable logic array as set forth in claim 17 wherein said array further comprises a third rank of FEs connected to receive as data input the output of the preceding first rank of FFPTs and to provide data output.

22. A programmable logic array as set forth in claim 21 wherein a second rank of FFPTs is connected to receive data outputs from said third rank of FEs and to provide output therefrom.

23. A pprogrammable logic array as set forth in claim 22 wherein said array further comprises a fourth rank of FEs connected to receive the output from said second rank of said FFPTs and to provide data output therefrom.

24. A programmable logic array as set forth in claim 23 wherein a third rank of FFPTs is connected to receive data output from said fourth rank of FEs and to provide output therefrom.

25. A programmable logic array as set forth in claim 24 wherein said logic array further comprises a rank of tri-state buffer circuits, each of which is connected to receive configuration logic and the data output from one of the FFPTs and wherein said configuration data either enables or disables the output of said tri-state buffer circuit, which, when enabled, may provide as output from the array the data input thereto from its corresponding FE and when disabled may provide a floating output.

26. A programmable logic array having a plurality of functional element means each having an output, a set of configuration inputs, and a set of data inputs which are uniquely assigned to each functional element means and having internal logic whereby said configuration inputs cause the output on one pass to be a predetermined one or other subset of all possible logic functions of the data inputs;

said functional elements means arranged in a plurality of ranks, the outputs of preceding ranks comprising the data inputs of succeeding ranks, and wherein the output from each functional element means in each preceding logic rank is provided as one input to at least one functional element means of a succeeding logic rank and at least one functional element means output in each preceding rank is provided to a data input of a plurality of functional element means in a succeeding logic rank.

* * * * *